(12) United States Patent
Watanabe et al.

(10) Patent No.: US 6,221,271 B1
(45) Date of Patent: Apr. 24, 2001

(54) PIEZOELECTRIC SINTERED CERAMICS AND PIEZOELECTRIC CERAMIC ELEMENTS CONSTITUTED THEREBY

(75) Inventors: Junichi Watanabe; Hiromi Kikuchi; Hideko Fukushima, all of Saitama-ken; Shigeru Jomura, Tottori-ken, all of (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 09/273,494

(22) Filed: Mar. 22, 1999

(30) Foreign Application Priority Data

Mar. 23, 1998 (JP) .................................................. 10-073744

(51) Int. Cl.$^7$ ...................... H01L 41/187; H01L 41/107; H02M 3/24
(52) U.S. Cl. .................................. 252/62.9 PZ; 501/134; 501/135; 501/136; 310/364
(58) Field of Search ...................... 252/62.9 PZ; 501/134, 501/135, 136; 310/364

(56) References Cited

FOREIGN PATENT DOCUMENTS

| | | |
|---|---|---|
| 63-288074 | 11/1988 | (JP) . |
| 5-114492 | 5/1993 | (JP) . |
| 6-112542 | 4/1994 | (JP) . |
| 7-302938 | 11/1995 | (JP) . |
| 10-270770 | * 10/1998 | (JP) . |

OTHER PUBLICATIONS

Fuda et al., Multilayer Piezoelectric Ceramic Vibrator With Internal Electrodes, Jpn. J. Appl. Phys., vol. 34, pp. 5270–5272 Sep. 1995.

* cited by examiner

Primary Examiner—C. Melissa Koslow
(74) Attorney, Agent, or Firm—Finnegan, Henderson, Farabow, Garrett & Dunner, L.L.P.

(57) ABSTRACT

A piezoelectric sintered ceramic made of (a) 100 parts by weight of main components having a composition represented by the general formula: $(Pb_{1-y}M_y)(Zr_zTi_{1-z})O_3$, wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag.

16 Claims, 1 Drawing Sheet

PIEZOELECTRIC SINTERED CERAMICS AND PIEZOELECTRIC CERAMIC ELEMENTS CONSTITUTED THEREBY

BACKGROUND OF THE INVENTION

The present invention relates to piezoelectric sintered ceramics and piezoelectric elements constituted by such piezoelectric sintered ceramics suitable for actuators and laminate-type piezoelectric transformers which are parts of inverter circuits for cold-cathode discharge tubes, backlights of small liquid crystal displays, etc.

Because liquid crystals used in liquid crystal displays do not light themselves, back-light systems having discharge tubes such as cold-cathode discharge tubes are generally mounted rear or either lateral side of liquid crystal displays. To drive the cold-cathode discharge tubes, AC voltage of several hundreds of volts or more is usually required, though actual voltage level may vary depending on the length and diameter of the discharge tubes used. Japanese Patent Laid-Open No. 5-114492 discloses an inverter comprising a piezoelectric ceramic element (piezoelectric transformer) as means for generating such a high AC voltage.

Figure 1:
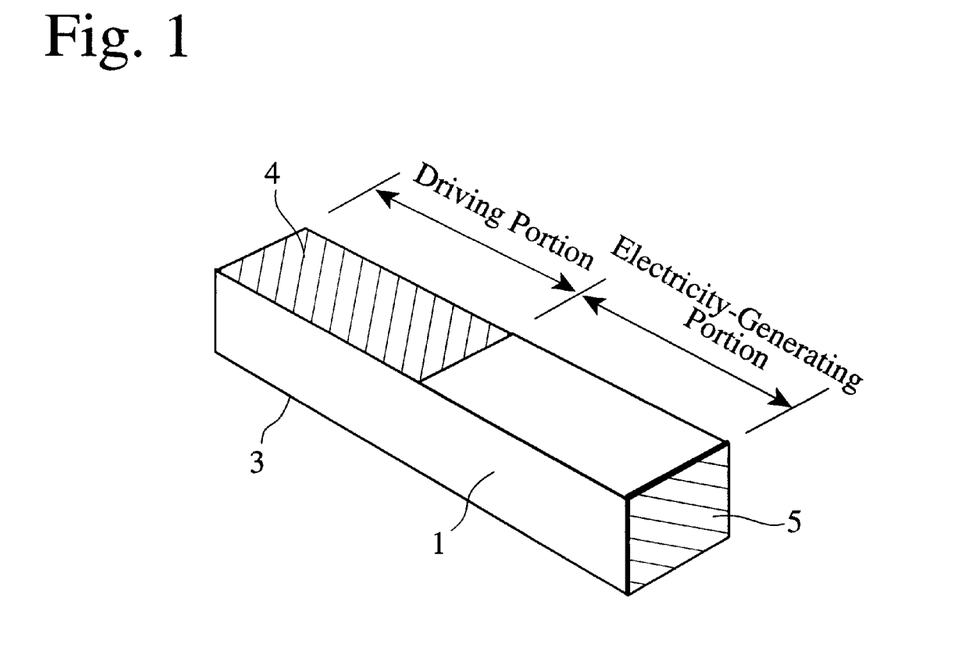
FIG. 1 is a perspective view showing the structure of a Rosen-type piezoelectric transformer.

This piezoelectric transformer has an extremely simple structure because wire winding is unnecessary, whereby it can be miniaturized, made thin and low in production cost. The structure and function of such a piezoelectric transformer will be described referring to FIG. 1. FIG. 1 schematically shows a Rosen-type piezoelectric transformer proposed by C. A. Rosen in 1956.

In FIG. 1, 1 represents a piezoelectric ceramic made of, for instance, $PbTiO_3$—$PbZrO_3$ (PZT). This piezoelectric transformer is coated with a pair of silver input electrodes 3, 4 on both upper and lower surfaces on the left side to form a driving portion and a silver output electrode 5 on the right side to form an electricity-generating portion. The piezoelectric transformer is polarized in a thickness direction in the driving portion in the left half and in a longitudinal direction in the electricity-generating portion in the right half, as indicated by the arrows A and B, respectively.

When AC voltage having substantially the same frequency as that of resonance frequency in the longitudinal direction of the piezoelectric ceramic 1 is applied between the input electrodes 3, 4, strong mechanical vibration occurs in the piezoelectric ceramic 1 in the longitudinal direction. As a result, electric charge is generated due to piezoelectric effects in the electricity-generating portion in the right half, whereby output voltage $V_o$ is generated between the output electrode 5 and one of the input electrodes, for instance, an input electrode 4.

Voltage step-up ratio ($V_o/V_i$), wherein $V_i$ is input voltage, achieved by the piezoelectric transformer having the above structure is expressed by the formula (1):

$$(V_o/V_i) = A \cdot k_{31} \cdot k_{33} \cdot Q_M \cdot L/T \quad (1),$$

wherein $k_{31}$ is an electromechanical coupling coefficient in transverse effect, $k_{33}$ is an electromechanical coupling coefficient in longitudinal effect, $Q_M$ is a mechanical quality coefficient, L is the length of the piezoelectric transformer, T is the thickness of the piezoelectric transformer, and A is a constant. $k_{31}$, $k_{33}$, and $Q_M$ are coefficients determined by the piezoelectric materials per se, and L and T are determined by the size of the piezoelectric ceramic element.

Because the piezoelectric transformers used for the above-described back-lights are required to provide as high AC voltage as several hundreds of volts or more, they should have a high voltage step-up ratio. For this purpose, it is effective to make the piezoelectric transformers as thin as possible and/or as long as possible, as is clear from the formula (1). However, their thickness and length are inevitably limited from the viewpoint of mounting space and mechanical strength.

Figure 2:
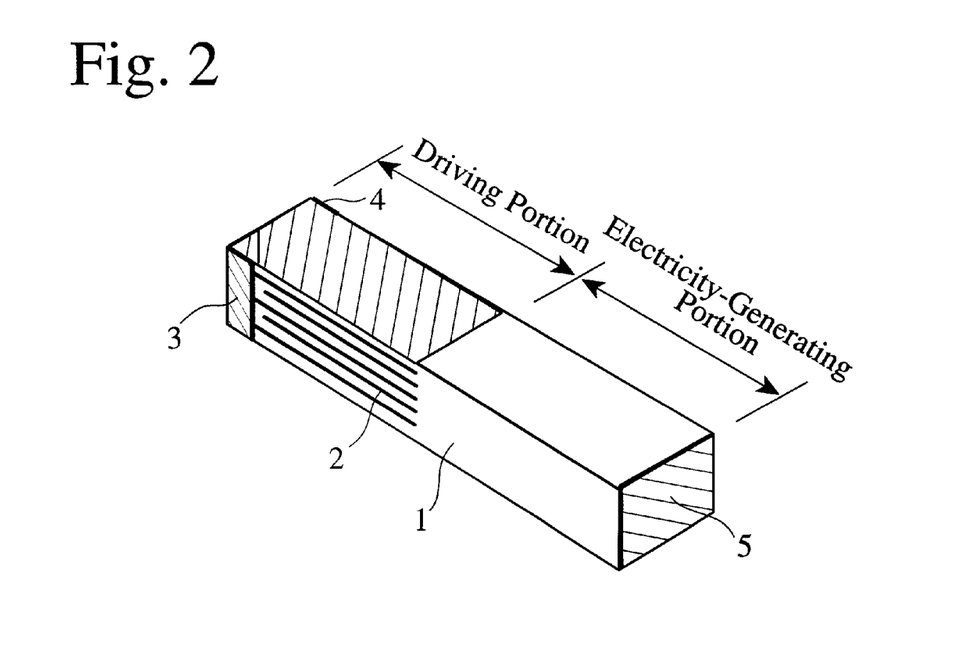
FIG. 2 is a perspective view showing the structure of a laminate-type piezoelectric transformer.

To solve these problems, Japanese Patent Laid-Open No. 7-302938 discloses a laminate-type piezoelectric transformer constituted by laminating thin piezoelectric ceramic sheets and connecting their driving portions in parallel. FIG. 2 schematically shows such a laminate-type piezoelectric transformer in which driving portions are laminated with internal electrodes 2 alternately and connected to the input electrodes 3, 4 in parallel. An output electrode 5 is attached to one longitudinal side of the laminate-type piezoelectric transformer.

The above-described laminate-type piezoelectric transformer constituted by laminating thin piezoelectric ceramic sheets 1 and internal electrodes 2 alternately can generally be produced in the same manner as laminate-type ceramic capacitors. Namely, a mixture of metal oxides of lead, zirconium, titanium, etc. is calcined and formed into green sheets each generally having a thickness of 50–150 μm. A precious metal paste is applied to a surface of each green sheet, for instance, by a screen printing method to form an input electrode 2. A plurality of electrode-coated green sheets are laminated, pressed into an integral body, and then sintered.

Precious metals used for the internal electrodes 2 of such laminate-type piezoelectric transformers should not be oxidized and melted at sintering temperatures, and they preferably are inexpensive. Thus, Ag—Pd alloys are generally used as internal electrode materials for the laminate-type piezoelectric transformers as in the case of the laminate-type ceramic capacitors. Ag—Pd alloys have as high melting points as 1554° C., for instance. The higher the percentage of Pd, the higher temperature the Ag—Pd alloys can withstand at sintering. However, because Pd is easily changeable in volume by oxidation and reduction during the sintering, too much Pd would be likely to cause the peeling (delamination) of piezoelectric ceramic sheets during the sintering. On the other hand, if the percentage of Pd were too small, the Ag—Pd alloys would have too low melting points, whereby the sintering temperatures of the piezoelectric ceramics should be decreased.

In the laminate-type ceramic capacitors, an Ag—Pd alloy having an Ag/Pd weight ratio of 70/30 is predominantly used as internal electrode materials. However, if this alloy is used for the laminate-type piezoelectric transformers, the piezoelectric ceramics should be sintered at temperatures of about 1100° C., which are much lower than the conventional sintering temperatures of about 1250° C. There have never been conventional piezoelectric ceramics that can be sintered at temperatures of about 1100° C.

According to Jpn. J. Appl. Phys. vol. 34, pp. 5270–5272 (1995), the laminates of conventional piezoelectric ceramics with internal electrodes of Ag—Pd alloys can be sintered in the air at 1100° C., about 100° C. lower than the sintering temperatures of the piezoelectric ceramics alone, due to the sintering acceleration function of the internal electrodes, thereby providing laminate-type piezoelectric ceramic vibrators excellent in piezoelectric properties. However, in the resultant laminate-type piezoelectric ceramic vibrators, crystal grains in portions near the internal electrodes grow too much, while portions distant from the internal electrodes have extremely uneven crystal structures having small crystal grains and insufficient density.

In the uneven crystal structures of the piezoelectric ceramics, pores and cracks are likely to be generated along crystal grain boundaries, resulting in small mechanical strength. Also, because the mechanical strength of the piezoelectric ceramics is inversely proportional to the crystal grain sizes thereof, the piezoelectric ceramic portions near the internal electrodes are weaker and more brittle than those distant from the internal electrodes. When piezoelectric ceramic elements are constituted by such conventional piezoelectric ceramics, higher input voltage leads to heat generation and decrease in voltage step-up ratio due to increase in internal loss, and mechanical breakage at the time of polarization and driving. Thus, such piezoelectric ceramic elements do not deserve practical use.

OBJECT AND SUMMARY OF THE INVENTION

Accordingly, an object of the present invention is to provide a piezoelectric sintered ceramic having a fine, uniform crystal structure and thus excellent piezoelectric properties and mechanical strength, which can be sintered at about 1100° C.

Another object of the present invention is to provide a piezoelectric ceramic element composed of such piezoelectric sintered ceramic.

The piezoelectric sintered ceramic according to the present invention comprises (a) 100 parts by weight of main components having a composition represented by the general formula:

$$(Pb_{1-y}M_y)(Zr_zTi_{1-z})O_3,$$

wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag.

In a preferred embodiment, an average crystal grain size of the piezoelectric sintered ceramic determined by crystal structure observation is 1 µm or less, and 80% by area or more of the crystal structure is occupied by crystal grains having particle sizes of 1 µm or less. The calcined main component powder, which is used to provide the piezoelectric sintered ceramic of the present invention, preferably comprises oxides of lead, zirconium, titanium and at least one M element and is calcined at 650–850° C. The calcined main component powder preferably contains Pb in an amount of 0.05–0.3 weight % more than defined by the above general formula.

The calcined main component powder is mixed with iron oxide powder and optionally silver powder to produce a mixture powder that is sintered. The calcined main component powder and the iron oxide powder in the mixture powder preferably have an average particle size of 1 µm or less.

The piezoelectric sintered ceramic is preferably sintered in a furnace atmosphere having an oxygen concentration of 1–80%. The piezoelectric sintered ceramic preferably has a porosity of less than 3%.

The piezoelectric ceramic element according to the present invention is constituted by the piezoelectric sintered ceramic comprising 100 parts by weight of main components composed of oxides of lead, zirconium, titanium and at least one M element, 0.05–1.0 parts by weight, as $Fe_2O_3$, of Fe, and 10–1000 ppm of Ag. The main components preferably have a composition represented by the general formula:

$$(Pb_{1-y}M_y)(Zr_zTi_{1-z})O_3,$$

wherein M is at least one element selected from the group consisting of Sr, Ba and Ca, and y and z are numbers satisfying $0.01 \leq y \leq 0.10$, and $0.51 \leq z \leq 0.56$, respectively.

The piezoelectric ceramic element preferably comprises a first portion constituted by an alternate laminate of a plurality of piezoelectric sintered ceramic layers and a plurality of silver-based, conductive layers; and a second portion constituted only by the piezoelectric sintered ceramic layers. The silver-based, conductive layers are preferably made of an Ag—Pd alloy having an Ag/Pd weight ratio of 60/40–80/20. Each piezoelectric sintered ceramic layer may have a thickness of 40–120 µm.

DETAILED DESCRIPTION OF THE PREFERRED EMBODIMENTS

As a result of research on the function of Ag—Pd alloys to accelerate the sintering of piezoelectric ceramics, it has been found that particularly Ag in the Ag—Pd alloys contributes to acceleration of the sintering of piezoelectric ceramics. It has also been found that during a burning process for forming laminate-type piezoelectric ceramic vibrators, Ag contained in internal electrodes and Pb contained in the calcined main component powder undergo a eutectic reaction, whereby Ag is liquefied at a temperature lower than its melting point to diffuse into the resultant piezoelectric ceramics. Further research has revealed that the amount of Ag diffused depends on the amount of Pb in the calcined main component powder, sintering temperatures and the amount of Ag contained in the internal electrodes.

Because Pb in the calcined main component powder contributes to the diffusion of Ag, the amount of Ag diffused is substantially in a positive, linear relation with the amount of Pb. Thus, the amount of Pb in the calcined main component powder is preferably determined such that it is 0.05–0.3 weight % more than defined by the general formula:

$$(Pb_{1-y}M_y)(Zr_zTi_{1-z})O_3,$$

wherein M is at least one element selected from the group consisting of Sr, Ba and Ca, and y and z are numbers satisfying $0.01 \leq y \leq 0.10$, and $0.51 \leq z \leq 0.56$, respectively. It is possible with this excess amount of Pb to prevent the vaporization of Pb during the sintering from making the amount of Pb stoichiometically insufficient, thereby providing the resultant piezoelectric sintered ceramics with sufficient sinterability. When the excessive amount of Pb is less than 0.05 weight %, sufficient sinterability cannot be achieved. On the other hand, when it exceeds 0.3 weight %, a high voltage step-up ratio cannot be obtained for piezoelectric transformers.

As a result of various studies, it has also been found that the amount of Ag diffused from the internal electrodes into the piezoelectric ceramics is positively correlated with the Ag content of the internal electrodes, and that it also is substantially in a positive, linear relation with the oxygen concentration of the sintering atmosphere (furnace atmosphere). The Ag content in the internal electrodes is preferably such that an Ag/Pd weight ratio is 80:20–60:40.

When the Ag/Pb weight ratio is more than 80:20, the Ag content in the piezoelectric sintered ceramics exceeds 1000 ppm, resulting in extremely poor insulation resistance. On the other hand, when the Ag/Pd weight ratio is less than 60:40, delamination easily occurs at about 1100° C. by the oxidation-reduction reaction of Pd.

To prevent the delamination without deteriorating the wettability of the internal electrodes with the piezoelectric ceramics, the oxygen concentration in the furnace atmosphere is preferably 1% or more, more preferably 1–80%, particularly 10–80%. The furnace atmosphere may be air.

In the conventional piezoelectric ceramics, the diffusion of Ag from the internal electrodes causes the segregation of Ag in the piezoelectric ceramics. As a result, crystal grains extremely grow in portions near the internal electrodes, while sintering is insufficient in portions distant from the internal electrodes, resulting in the lack of crystal grain growth and extremely uneven crystal structure.

Against this backdrop, the inventors have found that Fe is particularly effective as an additive for suppressing the segregation of Ag and thus for suppressing the excessive growth of crystal grains. They further have found that piezoelectric ceramics with fine, uniform crystal structures can be obtained by mixing main component powder composed of oxides of lead, zirconium, titanium, etc. and calcined at 650–850° C. with iron oxide, and by controlling the particle size of the resultant mixture powder to 1 $\mu$m or less.

The addition of Fe to the piezoelectric ceramics serves to increase mechanical quality coefficient $Q_M$, one of piezoelectric properties. The amount of Fe is preferably 0.05–1.0 parts by weight, as $Fe_2O_3$, per 100 parts by weight of the calcined main component powder. When the amount of Fe is less than 0.05 parts by weight, the effects of improving the mechanical quality coefficient $Q_M$ cannot sufficiently be obtained. On the other hand, when the amount of Fe is more than 1.0 parts by weight, the resultant piezoelectric ceramics are poor in sinterability. The more preferred amount of Fe is 0.3–0.8 parts by weight per 100 parts by weight of the calcined main component powder.

With fine, uniform crystal structures, the piezoelectric ceramics have high bending fracture resistance, because pores and cracks are less likely to exist between crystal grains. Further, the fine, uniform crystal structures enable the resultant laminate-type piezoelectric ceramic vibrators to have high resistance to breakage by continuous use for a long period of time, thus high reliability under repeated stress. The term "fine, uniform crystal structures" means crystal structures appearing on cross sections of piezoelectric ceramics, in which an average crystal grain size is 1 $\mu$m or less, with 80% by area or more of the crystal structure being occupied by crystal grains having particle sizes of 1 $\mu$m or less.

Ag contained in the piezoelectric ceramics exist together with a stoichiometrically excessive amount of Pb in boundaries of crystal grains in a main phase, contributing to increase in the sinterability of piezoelectric ceramics and thus lowering the sintering temperatures, for instance, to 1030–1150° C. When the amount of Ag in the piezoelectric ceramics exceeds 1000 ppm, a second phase composed of Ag, Pb and other elements is formed at triple points of crystal grain boundaries of the piezoelectric ceramics, whereby the piezoelectric ceramics are provided with extremely decreased insulation resistance, making polarization difficult. Also, when the amount of Ag is less than 10 ppm, poor wettability of the piezoelectric ceramics with the internal electrodes causes delamination, peeling of piezoelectric ceramic layers. Accordingly, the Ag content in the piezoelectric ceramics is preferably 10–1000 ppm, more preferably 200–300 ppm.

The piezoelectric ceramic composition may be mixed with Ag in advance. The tendency that Ag is evaporable at the time of sintering because of a low melting point thereof should be taken into consideration in deciding the amount of Ag added to the piezoelectric ceramic composition.

By substituting 1–10 atomic % of Pb in the piezoelectric ceramic composition with at least one of Sr, Ba and Ca, particularly with Sr, it is possible to improve the electromechanical coupling coefficients in both transverse and longitudinal effects and the mechanical quality coefficient, to lower the Curie temperatures (Tc), and further to make polarization easy. When the amount of Pb substituted exceeds 10 atomic %, the Curie temperature of the piezoelectric ceramics decrease drastically, providing the piezoelectric ceramic elements with unstable temperature properties.

By setting $0.51 \leq z \leq 0.56$ in the formula of $(Pb_{1-y}M_y)(Zr_zTi_{1-z})O_3$, the piezoelectric ceramic elements are provided with improved electromechanical coupling coefficients in transverse and longitudinal effects, decreased loss (tan $\delta$), increased voltage step-up ratio, and thus excellent conversion efficiency.

In a preferred embodiment of the present invention, the piezoelectric sintered ceramics may be produced by the steps of:

(1) calcining main components composed of oxides of lead, zirconium, titanium and at least one M element in such proportions as to provide a composition of $(Pb_{1-y}M_y)(Zr_zTi_{1-z})O_3$, with Pb 0.05–0.3 weight % in excess, at a temperature of 650–850° C.;

(2) mixing the resultant calcined main component powder with iron oxide powder and optionally Ag powder by wet-ball milling to provide a uniform mixture, such that powder in the mixture has an average particle size of 1 $\mu$m or less;

(3) forming the resultant mixture into green bodies; and (4) sintering the green bodies at 1030–1150° C. in an atmosphere containing 1–80% of oxygen.

In another preferred embodiment of the present invention, the piezoelectric ceramic elements such as piezoelectric transformers may be produced by the steps of:

(1) calcining main components composed of oxides of lead, zirconium, titanium and at least one M element in such proportions as to provide a composition of $(Pb_{1-y}M_y)(Zr_zTi_{1-z})O_3$, with Pb 0.05–0.3 weight % in excess, at a temperature of 650–850° C.;

(2) mixing the resultant calcined main component powder with iron oxide powder and optionally Ag powder by wet-ball milling to provide a uniform mixture, such that powder in the mixture has an average particle size of 1 $\mu$m or less;

(3) forming the resultant mixture into thin green sheets;

(4) coating one surface of each green sheet with an input electrode of an Ag—Pd alloy;

(5) laminating and pressing a plurality of thin electrode-coated green sheets into an integral laminate;

(6) sintering the integral laminate at 1030–1150° C. in an atmosphere containing 1–80% of oxygen; and (7) forming an output electrode on a surface of the sintered laminate.

Though the piezoelectric sintered ceramics have been described with respect to features derived from their compositions above, it should be noted that such features are not obtained from each component alone, but by a synergy of the components. Meeting all requirements of the composition of the present invention, piezoelectric sintered ceramics having fine, uniform crystal structures and thus excellent piezoelectric properties and mechanical strength can be obtained at sintering temperatures of about 1100° C. or lower. The piezoelectric sintered ceramics of the present invention preferably have a porosity of less than 3%.

The present invention will be described in detail referring to the following EXAMPLES without intention of limiting the present invention thereto.

EXAMPLE 1

Lead oxide, titanium oxide, zirconium oxide and strontium carbonate were mixed in a wet ball mill in such amounts that they formed a basic composition of $(Pb_{0.95}Sr_{0.05})(Zr_{0.52}Ti_{0.48})O_3$, with lead oxide 0.05–0.3 weight %, as Pb, more than required by the above basic composition. After drying, the resultant mixture was pulverized and calcined at 800° C. for 2 hours. 100 parts by weight of the resultant calcined powder was charged into a ball mill together with 0.7 parts by weight of $Fe_2O_3$ powder, wet-ball milled and dried to provide a mixture powder. Ball-milling time was controlled such that the mixture powder had an average particle size of 1 $\mu$m or less.

This mixture powder was mixed with PVB (polyvinyl butyral) as a binder and BPBG (butyl phthalyl butyl glycolate) as a plasticizer, both in amounts of 4 weight % based on the mixture powder. Their blending was carried out in ethyl alcohol as a solvent for 24 hours in a ball mill. After blending, defoaming and viscosity adjustment were conducted, and the resultant flowable mixture was formed into green sheets of 130 $\mu$m in thickness by a doctor blade method. Each green sheet was coated with an Ag—Pd alloy paste having an Ag/Pd weight ratio of 70/30 by a screen printing method to form an internal electrode having a thickness of 2–5 $\mu$m. 15 layers of the resultant internal electrode-coated green sheets were laminated, pressed and cut to a predetermined size to form an integral green compact. The integral green compact was placed in a sintering alumina jig, degreased, and then sintered at 1100° C. for 2 hours in the air. The resultant sintered body was printed with input and output electrodes and burned at 750° C., followed by the application of polarization voltage of 2 kV/mm at 140° C., to provide a laminate-type piezoelectric transformer of 25 mm×5 mm×2 mm.

Incidentally, the amount of Ag should be quantitatively analyzed in the piezoelectric sintered ceramic to determine how much Ag is contained in the piezoelectric sintered ceramics of the laminate-type piezoelectric transformers. In this EXAMPLE, an inductively coupled plasma emission spectroscopy (ICP) was carried out on samples cut away from the electricity-generating portions of the piezoelectric ceramics. Analyzed portions were 18–19 mm from the longitudinal end of the electricity-generating portions of the laminate-type piezoelectric transformers. The compositions of the piezoelectric sintered ceramics were also measured in the same portions as above.

The polarized piezoelectric transformer was subjected to a three-point bending test by applying a load in a laminate direction between supports of 12-mm span at a speed of 0.1 mm/min. Because the piezoelectric transformer should have large mechanical strength to withstand large displacement to provide a high voltage step-up ratio, it should desirably have a bending fracture resistance of 10 kgf/mm² or more. This bending fracture resistance was used as a reference for subsequent evaluation.

Insulation resistance on the input side of the laminate-type piezoelectric transformers was also measured at 100-V DC. Because the insulation resistance is preferably 100 MΩ or more, 100 MΩ was used as a reference.

A fracture surface of the piezoelectric ceramic was mirror-ground, etched with hydrochloric acid to make it easy to observe crystal grains. The crystal grain structure was photographed by a scanning electron microscope (SEM) at a magnification of 5000, and the resultant SEM photograph was scanned by an image analyzer (Luzex FS, available from Luzex) to measure the crystal grain size in an area of 2×3 inches. The measurement results were statistically treated to determine an average crystal grain size and a percentage by area of crystal structure occupied by crystal grains of 1 $\mu$m or less in a unit area. The results are shown in Table 1.

Comparative Example 1

EXAMPLE 1 was repeated to prepare piezoelectric ceramics except that lead oxide, titanium oxide, zirconium oxide and strontium carbonate were mixed in such amounts that they formed a basic composition of $(Pb_{0.95}Sr_{0.05})(Zr_{0.52}Ti_{0.48})O_3$, with no excess or 0.35 weight % (as Pb) excess of lead oxide more than required by the above basic composition. The same tests as in EXAMPLE 1 were conducted. The results are shown in Table 1.

TABLE 1

| Sample No.[1] | 1 | 2 | 3 | 4 | 5 |
|---|---|---|---|---|---|
| Excess Amount of Pb (wt. %) | 0 | 0.05 | 0.20 | 0.30 | 0.35 |
| Ag Content (ppm) | 90 | 170 | 270 | 490 | 1120 |
| Average Crystal Grain Size ($\mu$m) | 0.73 | 0.75 | 0.76 | 0.79 | 0.83 |
| Ratio of crystal grains ≧1 $\mu$m (%) | 87 | 86 | 84 | 83 | 81 |
| Curie Temperature (° C.) | 305 | 305 | 305 | 305 | 305 |
| Porosity (%) | 3.4 | 1.8 | 1.7 | 1.5 | 1.1 |
| Conversion Efficiency (%) | 89 | 92 | 93 | 93 | 94 |
| Bending Fracture Resistance (kgf/mm²) | 9.1 | 11.8 | 14.1 | 13.3 | 12.1 |
| Insulation Resistance (MΩ) | 1900 | 1850 | 1740 | 820 | 90 |

Note:
[1]Sample Nos. 2–4 are EXAMPLE 1, and Sample Nos. 1 and 5 are COMPARATIVE EXAMPLE 1.

Sample Nos. 1–5 are laminate-type piezoelectric transformers formed from piezoelectric ceramic compositions in which the Pb contents were 0–0.35 weight % in excess. Sample Nos. 2–4 in which the Pb contents were 0.05–0.30 weight % in excess had a porosity of 1.4–1.7%, indicating that they had sufficient sinterability. Sample Nos. 2–4 also had a conversion efficiency of 92–93% and a bending fracture resistance of 13.0–14.1 kgf/mm², both sufficiently high. On the other hand, Sample No. 1 containing no excess Pb had a porosity of 3.4% and low mechanical strength, indicating that it had insufficient sinterability. Also, Sample No. 5 containing Pb 0.35 weight % in excess had poor insulation resistance.

EXAMPLE 2

Lead oxide, titanium oxide, zirconium oxide and strontium carbonate were mixed in the same manner as in EXAMPLE 1 to prepare various main component powders having compositions of $(Pb_{1.0-y}Sr_y)(Zr_{0.52}Ti_{0.48})O_3$, wherein y was 0.01 or 0.09. The same procedures as in Example 1 were conducted to produce and test piezoelectric transformers. The results are shown in Table 2.

Comparative Example 2

Lead oxide, titanium oxide, zirconium oxide and strontium carbonate were mixed in the same manner as in EXAMPLE 2 to prepare a main component powder having a composition of $(Pb_{1.0-y}Sr_y)(Zr_{0.52}Ti_{0.48})O_3$, wherein y was 0.11. The same procedures as in Example 1 were conducted to produce and test piezoelectric transformers. The results are shown in Table 2.

TABLE 2

| Sample No.[1] | 6 | 7 | 8 | 9 |
|---|---|---|---|---|
| Amount of Pb Substituted (at. %) | 1 | 5 | 9 | 11 |
| Ag Content (ppm) | 240 | 270 | 310 | 280 |
| Average Crystal Grain Size (μm) | 0.77 | 0.76 | 0.75 | 0.76 |
| Ratio of crystal grains ≧1 μm (%) | 84 | 84 | 88 | 83 |
| Curie Temperature (° C.) | 345 | 305 | 260 | 235 |
| Porosity (%) | 1.7 | 1.8 | 1.6 | 1.7 |
| Conversion Efficiency (%) | 91 | 93 | 94 | 94 |
| Bending Fracture Resistance (kgf/mm²) | 13.8 | 14.1 | 14.2 | 12.9 |
| Insulation Resistance (MΩ) | 1900 | 1850 | 1390 | 1450 |

Note:
[1]Sample Nos. 6–8 are EXAMPLE 2, and Sample No. 9 is COMPARATIVE EXAMPLE 2.

Sample Nos. 6–9 are laminate-type piezoelectric transformers in which the amounts of Pb substituted by Sr were 1–11 atomic %. Sample Nos. 6–8 containing 1.0–9.0 atomic % of Sr were excellent not only in conversion efficiency but also in other properties. Also, Sample Nos. 6–8 had Curie temperatures (Tc) of 345–260° C., which shifted toward low temperatures as the amount of Sr increased. On the other hand, Sample No. 9 containing 11.0 atomic % of Sr had a Curie temperature (Tc) of 235° C., failing to be put into practical use because of poor reliability as a laminate-type piezoelectric transformer at high temperatures. Tendency appreciated from Table 2 suggests that when the amount of Sr is less than 1.0 atomic %, sufficient conversion efficiency cannot be achieved.

EXAMPLE 3

Lead oxide, titanium oxide, zirconium oxide and strontium carbonate were mixed in the same manner as in EXAMPLE 1 to prepare various main component powders having compositions of $(Pb_{0.95}Sr_{0.05})(Zr_zTi_{1-z})O_3$, wherein z was 0.51–0.56. The same procedures as in Example 1 were conducted to produce and test piezoelectric transformers. The results are shown in Table 3.

Comparative Example 3

Lead oxide, titanium oxide, zirconium oxide and strontium carbonate were mixed in the same manner as in EXAMPLE 1 to prepare various main component powders having compositions of $(Pb_{0.95}Sr_{0.05})(Zr_zTi_{1-z})O_3$, wherein z was 0.50 or 0.57. The same procedures as in Example 1 were conducted to produce and test piezoelectric transformers. The results are shown in Table 3.

TABLE 3

| Sample No.[1] | 10 | 11 | 12 | 13 | 14 |
|---|---|---|---|---|---|
| Excess Amount of Zr (atomic %) | 50 | 51 | 52 | 56 | 57 |
| Ag Content (ppm) | 260 | 260 | 270 | 260 | 280 |
| Average Crystal Grain Size (μm) | 0.76 | 0.76 | 0.76 | 0.75 | 0.75 |
| Ratio of crystal grains ≧1 μm (%) | 83 | 84 | 84 | 86 | 87 |
| Curie Temperature (° C.) | 310 | 295 | 305 | 290 | 305 |
| Porosity (%) | 1.8 | 1.8 | 1.8 | 1.7 | 1.7 |
| Conversion Efficiency (%) | 89 | 94 | 93 | 91 | 88 |
| Bending Fracture Resistance (kgf/mm²) | 12.8 | 13.0 | 14.1 | 14.2 | 13.8 |
| Insulation Resistance (MΩ) | 1660 | 1700 | 1850 | 1390 | 1450 |

Note:
[1]Sample Nos. 11–13 are EXAMPLE 3, and Sample Nos. 10 and 14 are COMPARATIVE EXAMPLE 3.

Sample Nos. 10–14 are laminate-type piezoelectric transformers, in which the amounts of Zr were 50–57 atomic %. Sample Nos. 11–13 containing 51–56 atomic % of Zr were excellent not only in conversion efficiency but also in other properties. On the other hand, Sample No. 10 containing 50 atomic % of Zr and Sample No. 14 containing 57 atomic % of Zr had as poor conversion efficiency as 89% and 88%, respectively, indicating that they were not suitable for piezoelectric transformers.

EXAMPLE 4

Lead oxide, titanium oxide, zirconium oxide and strontium carbonate were mixed in a wet ball mill in such proportions as to have a basic composition of $(Pb_{0.95}Sr_{0.05})(Zr_{0.52}Ti_{0.48})O_3$. After drying, the resultant main component mixture was pulverized and calcined at 800° C. for 2 hours. 100 parts by weight of the resultant calcined main component powder was wet-mixed with 0.1–0.9 parts by weight of $Fe_2O_3$ powder in a ball mill and dried to prepare a mixture powder. Ball-milling time was controlled such that the mixture powder had an average particle size of 1 μm or less. The same procedures as in Example 1 were conducted to produce and test piezoelectric transformers. The results are shown in Table 4.

Comparative Example 4

The same calcined main component powder as in EXAMPLE 4 was wet-ball milled and dried to provide a mixture powder containing no Fe. The resultant mixture powder was wet-ball milled with or without 1.1 weight % of $Fe_2O_3$. Ball-milling time was controlled such that the mixture powder had an average particle size of 1 μm or less. The same procedures as in Example 4 were conducted to produce and test piezoelectric transformers. The results are shown in Table 4.

TABLE 4

| Sample No.[1] | 15 | 16 | 17 | 18 | 19 | 20 |
|---|---|---|---|---|---|---|
| Amount of $Fe_2O_3$ (parts by weight) | 0.0 | 0.1 | 0.3 | 0.7 | 0.9 | 1.1 |
| Ag Content (ppm) | 260 | 270 | 260 | 270 | 280 | 270 |
| Average Crystal Grain Size (μm) | 3.0 | 0.97 | 0.88 | 0.76 | 0.64 | 0.58 |
| Ratio of crystal grains ≧1 μm (%) | 24 | 80 | 81 | 84 | 88 | 96 |
| Curie Temperature (° C.) | 310 | 305 | 305 | 305 | 300 | 300 |
| Porosity (%) | 2.6 | 2.0 | 1.9 | 1.8 | 2.5 | 3.1 |
| Conversion Efficiency (%) | 86 | 92 | 93 | 93 | 91 | 89 |

TABLE 4-continued

| Sample No.[1] | 15 | 16 | 17 | 18 | 19 | 20 |
|---|---|---|---|---|---|---|
| Bending Fracture Resistance (kgf/mm$^2$) | 8.1 | 12.1 | 13.3 | 14.1 | 11.9 | 9.2 |
| Insulation Resistance (MΩ) | 1820 | 1740 | 1640 | 1850 | 1090 | 980 |

Note:
[1]Sample Nos. 16–19 are EXAMPLE 4, and Sample Nos. 15 and 20 are COMPARATIVE EXAMPLE 4.

Sample Nos. 15–20 are laminate-type piezoelectric transformers constituted by piezoelectric sintered ceramics containing 0–1.1 parts by weight, as $Fe_2O_3$, of Fe per 100 parts by weight of the main components. Sample Nos. 16–19 containing 0.1–0.9 parts by weight of Fe were excellent not only in conversion efficiency but also in other properties. They had uniform, fine crystal structures in which the average crystal grain size was 0.97–0.64 μm, and the percentage of crystal structure occupied by crystal grains having particle sizes of 1 μm or less was 80–88%. On the other hand, Sample No. 15 containing no Fe had an average crystal grain size of 3.0 μm, about 4 times larger than those of EXAMPLE 4, indicating extreme growth of crystal grains. Thus, Sample No. 15 had extremely poor conversion efficiency and bending fracture resistance. Also, Sample No. 20 containing 1.1 parts by weight of Fe had a porosity of 3.1% and poor bending fracture resistance, indicating that it had insufficient sinterability.

EXAMPLE 5

100 parts by weight of the calcined main component powder as in EXAMPLE 4 was wet-ball milled with 0.7 parts by weight of $Fe_2O_3$ to provide a mixture powder, which was formed into green bodies. The green bodies were degreased and sintered at 1100° C. for 2 hours in an alumina jig in a batch furnace whose $N_2$ atmosphere was precisely replaced by 1–100% of oxygen. The same procedures as in Example 1 were conducted to produce and test laminate-type piezoelectric transformers. The results are shown in Table 5.

Comparative Example 5

EXAMPLE 5 was repeated to prepare piezoelectric transformers except that the sintering atmosphere in the batch furnace was $N_2$, containing no oxygen. The resultant laminate-type piezoelectric transformers were tested in the same manner as in EXAMPLE 5. The results are shown in Table 5.

TABLE 5

| Sample No.[1] | 21 | 22 | 23 | 24 | 25 | 26 |
|---|---|---|---|---|---|---|
| $O_2$ Concentration in Furnace (%) | 0 | 1 | 10 | 21 | 80 | 100 |
| Ag Content (ppm) | 3 | 90 | 220 | 270 | 390 | 560 |
| Average Crystal Grain Size (μm) | 0.71 | 0.73 | 0.75 | 0.76 | 0.81 | 0.94 |
| Ratio of crystal grains ≧1 μm (%) | 89 | 87 | 85 | 84 | 82 | 76 |
| Curie Temperature (° C.) | — | 305 | 305 | 305 | 305 | 305 |
| Porosity (%) | — | 2.4 | 1.9 | 1.8 | 1.7 | 1.6 |
| Conversion Efficiency (%) | — | 90 | 92 | 93 | 92 | 91 |

TABLE 5-continued

| Sample No.[1] | 21 | 22 | 23 | 24 | 25 | 26 |
|---|---|---|---|---|---|---|
| Bending Fracture Resistance (kgf/mm$^2$) | — | 13.1 | 13.7 | 14.1 | 15.2 | 15.3 |
| Insulation Resistance (MΩ) | — | 2350 | 2010 | 1850 | 1730 | 740 |

Note:
[1]Sample Nos. 22–26 are EXAMPLE 5, and Sample No. 21 is COMPARATIVE EXAMPLE 5.

Sample Nos. 22–26 are laminate-type piezoelectric transformers constituted by piezoelectric sintered ceramics, which were formed by sintering 100 parts by weight of $(Pb_{0.95}Sr_{0.05})(Zr_{0.52}Ti_{0.48})O_3$ and 0.7 parts by weight of $Fe_2O_3$, in a furnace atmosphere containing 0–100% of oxygen. Sample Nos. 22–26 obtained by sintering in an $N_2$ atmosphere having an oxygen concentration of 1–100% had a porosity of 1.6–2.4%, indicating that they had sufficient sinterability. They also were excellent in other properties. On the other hand, Sample No. 21 obtained by sintering in an $N_2$ atmosphere containing no oxygen suffered from delamination, failing to measure other properties. The Ag content increased from 3 ppm to 560 ppm in the piezoelectric sintered ceramics, as the oxygen concentration in the furnace atmosphere increased from 0% to 100%.

EXAMPLE 6

Lead oxide, titanium oxide, zirconium oxide and strontium carbonate were mixed in a wet ball mill in such proportions as to have a basic composition of $(Pb_{0.95}Sr_{0.05})(Zr_{0.52}Ti_{0.48})O_3$, dried, pulverized and calcined at 800° C. for 2 hours. 100 parts by weight of the resultant calcined main component powder was wet-ball milled with 0.7 parts by weight of $Fe_2O_3$ and dried. Ball-milling time was controlled such that the resultant mixture powder had an average particle size of 1 μm or less. The same procedures as in Example 1 were conducted to produce and test laminate-type piezoelectric transformers. The results are shown in Table 6.

Comparative Example 6

100 parts by weight of the same calcined main component powder as in EXAMPLE 6 was wet-milled with 0.7 parts by weight of $Fe_2O_3$ under the conditions of providing an average particle size of more than 1 μm. Also, the mixture powder of this COMPARATIVE EXAMPLE 6 having an average particle size of 1.25 μm, more than 1 μm, was mixed with the mixture powder of Sample No. 27 (EXAMPLE 6) having an average particle size of 1 μm or less at a weight ratio of 1:1. The same procedures as in Example 6 were conducted to produce and test laminate-type piezoelectric transformers. The results are shown in Table 6.

TABLE 6

| Sample No.[1] | 27 | 28 | 29 | 30 | 31 |
|---|---|---|---|---|---|
| Particle Size of Mixture Powder (μm) | 0.31 | 0.52 | 0.82 | 1.25 | 0.31 + 1.25 |
| Ag Content (ppm) | 260 | 270 | 270 | 280 | 270 |
| Average Crystal Grain Size (μm) | 0.64 | 0.76 | 0.94 | 1.33 | 0.92 |
| Ratio of Crystal Grains ≧1 μm (%) | 94 | 84 | 80 | 19 | 71 |
| Curie Temperature (° C.) | 305 | 305 | 305 | 305 | 305 |
| Porosity (%) | 1.0 | 1.8 | 2.1 | 2.9 | 3.4 |
| Conversion Efficiency (%) | 94 | 93 | 90 | 87 | 88 |

TABLE 6-continued

| Sample No.[1] | 27 | 28 | 29 | 30 | 31 |
|---|---|---|---|---|---|
| Bending Fracture Resistance (kgf/mm$^2$) | 16.7 | 14.1 | 10.4 | 8.1 | 9.2 |
| Insulation Resistance (MΩ) | 1920 | 1850 | 1740 | 1830 | 1650 |

Note:
[1]Sample Nos. 27–29 are EXAMPLE 6, and Sample Nos. 30–31 are COMPARATIVE EXAMPLE 6.

Sample Nos. 27–31 are piezoelectric transformers constituted by piezoelectric sintered ceramics formed from mixture powders having average particle sizes ranging from 0.31 μm to 1.25 μm and 0.31 μm+1.25 μm. Sample Nos. 27–29 formed from mixture powders having average particle sizes ranging from 0.31 μm to 0.82 μm were excellent not only in conversion efficiency but also in other properties. These piezoelectric sintered ceramics had uniform, fine crystal structures in which the average crystal grain size was 1 μm or less, and 80% by area or more of the crystal structure was occupied by crystal grains having particle sizes of 1 μm or less. These piezoelectric sintered ceramics also had small porosity and excellent bending fracture resistance.

On the other hand, piezoelectric sintered ceramic (Sample No. 30) formed from mixture powder having an average particle size of 1.25 μm had an average crystal grain size of more than 1 μm, with the percentage by area of crystal structure occupied by crystal grains of 1 μm or less being about 20%. This piezoelectric sintered ceramic had extremely poor bending fracture resistance and conversion efficiency.

Further, in the piezoelectric sintered ceramic (Sample No. 31) formed from a combination of two mixture powders having average particle sizes of 1.25 μm and 0.31 μm, respectively, the percentage by area of crystal structure occupied by crystal grains of 1 μm or less was as low as about 70%, leading to a poor bending fracture resistance, though its average crystal grain size was 1 μm or less.

EXAMPLE 7

Green sheets produced in the same manner as in EXAMPLE 6 were coated with Ag—Pd alloy pastes for internal electrodes having Ag/Pd weight ratios of 60/40–80/20 by a screen printing method. The internal electrode-coated green sheets were laminated in 15 layers, pressed and cut to provide green bodies. The green bodies were sintered in the same manner as in EXAMPLE 1 to produce laminate-type piezoelectric transformers, which were then tested. The results are shown in Table 7.

Comparative Example 7

EXAMPLE 7 was repeated to produce laminate-type piezoelectric transformers except for using Ag—Pd alloy pastes having Ag/Pd weight ratios of 50/50 and 90/10, respectively. The resultant laminate-type piezoelectric transformers were tested in the same manner as in EXAMPLE 7. The results are shown in Table 7.

TABLE 7

| Sample No.[1] | 32 | 33 | 34 | 35 | 36 |
|---|---|---|---|---|---|
| Ag/Pd Weight Ratio | 50:50 | 60:40 | 70:30 | 80:20 | 90:10 |
| Ag Content (ppm) | 180 | 210 | 270 | 510 | 1180 |
| Average Crystal Grain Size (μm) | 0.71 | 0.73 | 0.76 | 0.77 | 0.98 |

TABLE 7-continued

| Sample No.[1] | 32 | 33 | 34 | 35 | 36 |
|---|---|---|---|---|---|
| Ratio of Crystal Grains ≧1 μm (%) | 88 | 86 | 84 | 83 | 71 |
| Curie Temperature (° C.) | — | 305 | 305 | 305 | 305 |
| Porosity (%) | — | 1.1 | 1.8 | 1.7 | 1.6 |
| Conversion Efficiency (%) | — | 94 | 93 | 91 | 88 |
| Bending Fracture Resistance (kgf/mm$^2$) | — | 14.9 | 14.1 | 13.2 | 11.1 |
| Insulation Resistance (MΩ) | — | 2230 | 1850 | 790 | 85 |

Note:
[1]Sample Nos. 33–34 are EXAMPLE 7, and Sample Nos. 32 and 35–36 are COMPARATIVE EXAMPLE 7.

Sample Nos. 32–36 are laminate-type piezoelectric transformers with internal electrodes formed from Ag—Pd alloy pastes having Ag/Pd weight ratios of 50:50–90:10 and sintered in an atmosphere containing 21% of oxygen (air). The Ag content increased as the percentage of Ag in the Ag—Pd alloy pastes increased. In Sample No. 32 in which the Ag/Pd weight ratio was 50:50, the internal electrodes were not sintered at a temperature of 1100° C., causing delamination. Also, in Sample No. 36 in which the Ag/Pd weight ratio was 90:10, the Ag content exceeded 1000 ppm, resulting in extremely poor insulation resistance that made it impossible to carry out polarization.

EXAMPLE 8

Lead oxide, titanium oxide, zirconium oxide and strontium carbonate were mixed in a wet ball mill in such proportions as to have a basic composition of $(Pb_{0.95}Sr_{0.05})(Zr_{0.52}Ti_{0.48})O_3$, dried, pulverized and calcined at 800° C. for 2 hours. 100 parts by weight of the resultant calcined main component powder was wet-ball milled with 0.7 parts by weight of $Fe_2O_3$ and Ag powder in amounts shown in Table 8. The resultant mixture powder had an average particle size of 1 μm or less. The same procedures as in Example 1 were conducted to produce and test laminate-type piezoelectric transformers. The results are shown in Table 8.

TABLE 8

| Sample No. | 37 | 38 |
|---|---|---|
| Ag Content in Calcined Powder (wt. %) | 0.05 | 0.1 |
| Ag Content (ppm) | 280 | 610 |
| Average Crystal Grain Size (μm) | 0.79 | 0.82 |
| Ratio of Crystal Grains ≧ 1 μm (%) | 83 | 81 |
| Curie Temperature (° C.) | 305 | 300 |
| Porosity (%) | 1.6 | 1.9 |
| Conversion Efficiency (%) | 93 | 92 |
| Bending Fracture Resistance (kgf/mm$^2$) | 13.8 | 13.1 |
| Insulation Resistance (MΩ) | 1800 | 580 |

Sample Nos. 37 and 38 are laminate-type piezoelectric transformers produced from $(Pb_{0.95}Sr_{0.05})(Zr_{0.52}Ti_{0.48})O_3$, 0.7 weight % of $Fe_2O_3$ and Ag in amounts of 0.05 weight % and 0.1 weight %, respectively. Because a large proportion of Ag evaporates during sintering, the remaining amount of Ag may vary depending on the sintering temperature, atmosphere, time, etc. It should be noted that the Ag contents in the piezoelectric sintered ceramics are not identical to the amounts of Ag added to the calcined main component powder.

It is clear from Table 8 that all piezoelectric sintered ceramic samples had fine, uniform crystal structures and thus excellent properties, suitable for laminate-type piezoelectric transformers.

Though the above EXAMPLES indicate Rosen-type, laminate-type, piezoelectric transformers, it should be noted that the present invention is not restricted thereto, and that the present invention is applicable to other types of piezoelectric ceramic elements.

As described above in detail, the piezoelectric ceramics of the present invention have fine, uniform crystal structures and are sinterable at about 1100° C. or lower. Such piezoelectric ceramics have excellent piezoelectric properties and mechanical strength, suitable for piezoelectric transformers.

What is claimed is:

1. A piezoelectric sintered ceramic comprising (a) 100 parts by weight of main components having a composition represented by the general formula:

wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag.

2. A piezoelectric ceramic element including a piezoelectric sintered ceramic comprising 100 parts by weight of main components composed of oxides of lead, zirconium, titanium and at least one M element; 0.05–1.0 parts by weight, as $Fe_2O_3$, of Fe; and 10–1000 ppm of Ag.

3. The piezoelectric ceramic element according to claim 2, wherein said main components have a composition represented by the general formula:

wherein M is at least one element selected from the group consisting of Sr, Ba and Ca, and y and z are numbers satisfying $0.01 \leq y \leq 0.10$, and $0.51 \leq z \leq 0.56$, respectively.

4. The piezoelectric ceramic element according to claim 2, comprising a first portion constituted of an alternate laminate of a plurality of piezoelectric sintered ceramic layers and a plurality of conductive silver-based layers; and a second portion constituted only piezoelectric sintered ceramic layers.

5. The piezoelectric ceramic element according to claim 2, further comprising silver-based conductive layers made of an Ag—Pd alloy having an Ag/Pd weight ratio of 60/40–80/20.

6. A piezoelectric sintered ceramic comprising (a) 100 parts by weight of main components having a composition represented by the general formula:

wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag, said piezoelectric sintered ceramic having an average crystal grain size of 1 μm or less and a crystal structure in which at least 80% by area of said crystal structure is occupied by crystal grains having particle sizes of 1 μm or less.

7. A piezoelectric sintered ceramic comprising (a) 100 parts by weight of main components having a composition represented by the general formula:

wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag; wherein said piezoelectric sintered ceramic is produced from a powder having an amount of Pb 0.03–0.3 wt. % in excess of the amount of Pb defined by the general formula.

8. A piezoelectric sintered ceramic comprising (a) 100 parts by weight of main components having a composition represented by the general formula:

wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag, wherein said piezoelectric sintered ceramic is produced by sintering a powder mixture comprising oxides of lead, zirconium, titanium and at least one M element calcined at 650–850° C., and iron oxide powder, said powder mixture having an average particle size of 1 μm or less.

9. A piezoelectric sintered ceramic comprising (a) 100 parts by weight of main components having a composition represented by the general formula:

wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag, wherein said piezoelectric sintered ceramic is produced from a powder mixture comprising oxides of lead, zirconium, titanium and at least one M element calcined at 650–850° C., iron oxide powder, and silver powder, said powder mixture having an average particle size of 1 μm or less.

10. A piezoelectric sintered ceramic comprising (a) 100 parts by weight of main components having a composition represented by the general formula:

wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag, wherein said piezoelectric sintered ceramic is sintered in a furnace atmosphere having an oxygen concentration of 1–80%.

11. A piezoelectric sintered ceramic comprising (a) 100 parts by weight of main components having a composition represented by the general formula:

wherein M is at least one element selected from the group consisting of Sr, Ba and Ca, and y and z are numbers satisfying $0.01 \leq y \leq 0.10$, and $0.51 \leq z \leq 0.56$, respectively; (b) 0.05–1.0 parts by weight, as $Fe_2O_3$, of Fe; and (c) 10–1000 ppm of Ag, said piezoelectric sintered ceramic having a porosity of less than 3%.

12. A piezoelectric ceramic element including a piezoelectric sintered ceramic comprising 100 parts by weight of main components composed of oxides of lead, zirconium, titanium and at least one M element; 0.05–1.0 parts by weight, as $Fe_2O_3$, of Fe; and 10–1000 ppm of Ag, said piezoelectric ceramic element having an average crystal grain size of 1 μm or less and a crystal structure in which at least 80% by area of said crystal structure is occupied by crystal grains having particle sizes of 1 μm or less.

13. A piezoelectric ceramic element including a piezoelectric sintered ceramic comprising 100 parts by weight of main components composed of oxides of lead, zirconium, titanium and at least one M element; 0.05–1.0 parts by weight, as $Fe_2O_3$, of Fe; and 10–1000 ppm of Ag, said piezoelectric ceramic element having an average crystal grain size of 1 μm or less and a crystal structure in which at least 80% by area of said crystal structure is occupied by crystal grains having particle sizes of 1 μm or less, said piezoelectric ceramic element further comprising a first portion constituted of an alternate laminate of a plurality of piezoelectric sintered ceramic layers and a plurality of conductive silver-based layers, and a second portion constituted only of piezoelectric sintered ceramic layers.

14. A piezoelectric ceramic element including a piezoelectric sintered ceramic comprising 100 parts by weight of main components composed of oxides of lead, zirconium, titanium and at least one M element; 0.05–1.0 parts by weight, as $Fe_2O_3$, of Fe; and 10–1000 ppm of Ag, said piezoelectric ceramic element further comprising a first portion constituted of an alternate laminate of a plurality of piezoelectric sintered ceramic layers and a plurality of conductive silver-based layers, and a second portion constituted only of piezoelectric sintered ceramic layers, wherein said conductive silver-based layers are made of an Ag—Pd alloy having an Ag/Pd weight ratio of 60/40–80/20.

15. A piezoelectric ceramic element including a piezoelectric sintered ceramic comprising 100 parts by weight of main components composed of oxides of lead, zirconium, titanium and at least one M element; 0.05–1.0 parts by weight, as $Fe_2O_3$, of Fe; and 10–1000 ppm of Ag, said piezoelectric ceramic element having a porosity of less than 3%.

16. A piezoelectric ceramic element including a piezoelectric sintered ceramic comprising 100 parts by weight of main components composed of oxides of lead, zirconium, titanium and at least one M element; 0.05–1.0 parts by weight, as $Fe_2O_3$, of Fe; and 10–1000 ppm of Ag, said piezoelectric ceramic element having a porosity of less than 3%, and comprising a first portion constituted of an alternate laminate of a plurality of piezoelectric sintered ceramic layers and a plurality of conductive silver-based layers, and a second portion constituted only of piezoelectric sintered ceramic layers.

* * * * *